United States Patent [19]
Smith

[11] Patent Number: 6,049,119
[45] Date of Patent: *Apr. 11, 2000

[54] PROTECTION CIRCUIT FOR A SEMICONDUCTOR DEVICE

[75] Inventor: Jeremy C. Smith, Austin, Tex.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 09/071,323

[22] Filed: May 1, 1998

[51] Int. Cl.$^7$ .......................... H01L 27/082; H01L 29/00; H01L 27/102; H01L 29/70
[52] U.S. Cl. .......................... 257/575; 257/565; 257/557; 257/370; 257/546; 257/355; 257/382
[58] Field of Search ..................... 257/575, 565, 257/557, 370, 423, 546, 355, 360, 361, 362, 350, 273, 378, 382

[56] References Cited

U.S. PATENT DOCUMENTS

| | | | |
|---|---|---|---|
| 5,060,044 | 10/1991 | Tomassetti | 357/43 |
| 5,119,160 | 6/1992 | Hall | 357/43 |
| 5,166,089 | 11/1992 | Chen et al. | 257/355 |
| 5,218,228 | 6/1993 | Williams et al. | 257/557 |
| 5,219,784 | 6/1993 | Solheim | 437/57 |
| 5,465,189 | 11/1995 | Polgreen et al. | 361/58 |
| 5,504,368 | 4/1996 | Sawada | 257/575 |
| 5,530,612 | 6/1996 | Maloney | 361/56 |
| 5,539,327 | 7/1996 | Shigehara et al. | 326/30 |
| 5,602,404 | 2/1997 | Chen et al. | 257/112 |
| 5,635,746 | 6/1997 | Kimura et al. | 257/382 |
| 5,726,844 | 3/1998 | Smith | 361/56 |
| 5,742,084 | 4/1998 | Yu | 257/356 |

OTHER PUBLICATIONS

Amerasekera et al.; "Substrate Triggering and Salicide Effects on ESD Performance and Protection Circuit Design in Deep Submicron CMOS Processes;" IEDM 95; pp. 547–550 (1995).

Voldman et al.; "Analysis of Snubber–Clamped Diode–String Mixed Voltage Interface ESD Protection Network for Advanced Microprocessors;" EOS/ESD Symposium 95; pp. 43–61 (1995).

Tandan; "ESD Trigger Circuit;" EOS/ESD Symposium 94 (1994).

"A Subtrate Triggered Lateral Bipolar Circuit for High Voltage Tolerant ESD Protection Applications," Jeremy C. Smith.

"EOS/ESD Analysis of High–Density Logic Chips", Ramaswamy, et al.; EOS/ESD Symposium 96; pp.285–290.

Primary Examiner—Mahshid Saadat
Assistant Examiner—Jesse A. Fenty

[57] ABSTRACT

A semiconductor device having a substrate with a first conductivity type. The substrate has a top substrate region that also has the first conductivity type. A first doped region, a second doped region and a third doped region are located in the top substrate region where the first and second doped regions have a second conductivity type opposite the first conductivity type while the third doped region has the first conductivity type and where the third doped region is between the first and second doped regions. A doped well region is also in the top substrate region and has the second conductivity type and has the second doped region and at least a portion of the third doped region located therein. A method of forming the device is also provided herein.

26 Claims, 3 Drawing Sheets

PROTECTION CIRCUIT FOR A SEMICONDUCTOR DEVICE

RELATED APPLICATION

This is related to U.S. patent application Ser. No. 08/801,874 filed Feb. 18, 1997, entitled "Circuit for Electrostatic Discharge (ESD) Protection," as filed, which is assigned to the current assignee hereof.

FIELD OF THE INVENTION

The present invention generally relates to semiconductor devices, and more particularly, to a lateral bipolar device that provides substrate triggered electrostatic discharge (ESD) or electrical overstress (EOS) protection and a method of forming such device.

BACKGROUND OF THE INVENTION

As semiconductor devices move to smaller geometries, chip level power supply voltages have also scaled downward. However, system level power supply voltages have scaled at a much slower rate than individual chip supply voltages, requiring high voltage tolerant input and output pads to limit the maximum voltages appearing across semiconductor devices on the integrated circuit that may be damaged by the high voltage signals. Special design techniques must be employed for these high voltage tolerant input/output pad circuits, since the magnitude of the high voltage signals usually exceeds maximum allowable transistor terminal potentials such as drain-to-source ($V_{DS}$), drain-to-gate ($V_{DG}$) and gate-to-source ($V_{GS}$) of the metal oxide semiconductor field-effect transistors (MOSFETs) in a given technology.

High voltage tolerant input/output pads also have ESD protection circuits that must not operate within the normal operating range of the high voltage signals. In the past, a bipolar device, e.g. a thick field-oxide (TFO) npn device, has been used since such a bipolar device is a good dissipation element to protect against electrostatic discharges and since the voltage at which the TFO begins to conduct current is above the normal operating range of applied signals but below the potential at which damage occurs in the internal circuitry. Prior art FIG. 1 is a partial block diagram, partial schematic diagram of a TFO npn device. In FIG. 1, the TFO npn device 3 provides ESD protection by a well known phenomenon known as bipolar snapback. During bipolar snapback, a parasitic bipolar device formed by a first n+ diffusion 8 coupled to the bondpad 20 (collector) and a second n+ diffusion 7 coupled to the chip $V_{ss}$ 45 (emitter), where the two diffusions are separated by a TFO 6, can conduct large amounts of ESD discharge current by means of a self-biased mechanism. The self-biasing results from avalanche-breakdown at the collector/base (i.e. n+ pad to p-substrate) diffusion where avalanche-generated electron-hole pairs are created. The holes generated from this effect ($I_{SUB}$) migrate through the substrate 4 and its associated resistance (labeled $R_{SUB}$) towards the emitter and P+ top-substrate contact. When the product of $I_{SUB} \times R_{SUB} > 0.7V$ the base-emitter junction (i.e. n+ $V_{ss}$ to p-substrate) of the TFO npn device 3 will forward bias, thereby turning the device on. The particular collector-to-emitter voltage where this effect occurs is known as $V_{T1}$. Thereafter the collector-to-emitter voltage decreases as the current increases, "snapping back" from $V_{T1}$. Later, the trend reverses, causing the collector-to-emitter voltage to rise as the current also rises. Eventually, the bipolar transistor fails at another particular collector-to-emitter voltage $V_{T2}$. The destructive failure current threshold associated with $V_{T2}$ is $I_{T2}$, beyond which, the TFO npn device 3 is permanently damaged. Thus, the useful range of current conduction for ESD protection with the TFO npn device 3 (or any other lateral bipolar device) begins at $V_{T1}$ and ends at ($V_{T2}$, $I_{T2}$). The use of low resistivity epitaxial substrates of modern semiconductor process makes $V_{T1}$ of the TFO npn device 3 too high for ESD protection. The problem with the TFO npn device is that the trigger voltage of the TFO npn device, that is, the particular collector-to-emitter voltage at which the TFO begins to conduct current, is too high for modem devices (e.g. 15V). Such a high trigger voltage may permit damage in the devices in the high voltage tolerant input/output pads before any ESD protection can occur. A need therefore exists to lower the trigger voltage of such a bipolar device so that the device "triggers" earlier, to guarantee that the input/output pad circuitry is not damaged.

A technique for lowering the trigger voltage of a lateral npn bipolar device inherent in any NMOS device is by raising the local substrate potential to thereby "substrate trigger" the device which has been shown to be effective in the publication "Substrate Triggering and Salicide Effects on ESD Performance and Protection Circuit Design in Submicron CMOS Processes", Ameraskera et al., 95 IEDM pp. 547–50, incorporated by reference herein. However, the NMOS device cannot serve as a protection element for high voltage tolerant applications since the magnitude of these high voltage signals usually exceeds the maximum allowable terminal potentials. The maximum allowable terminal potentials are usually slightly higher than the maximum allowable power supply voltages for a given technology. For example, if a given technology has a maximum power supply voltage of 3.3V, then the maximum $V_{DS}$, $V_{DG}$ and $V_{GS}$ of MOSFETs in the technology may be 3.6V. It is a common requirement for integrated circuits fabricated in such a technology to be tolerant of 5V input signals. Thus, this type of chip cannot use the NMOS (and its associated parasitic npn bipolar device) as an ESD protection element. This will continue to be a limitation as technology advances since newer chips must be backward compatible with the signal levels of older chips used in the same system, and since as chip (and system) power supplies scale downwards, so will the maximum allowable terminal potentials of transistors in these technologies. Therefore, a need exists to reduce the trigger voltage of a TFO npn device or similar lateral npn device to a potential below MOSFET failure thresholds, so that it can be used to provide ESD protection for high voltage tolerant applications. A need also exists to increase the current gain ($\beta$) of these devices to increase ESD robustness. Furthermore, if lateral npn devices are used, the base electrode is usually the chip substrate, which is very closely coupled to ground in modern technologies due to the use of epitaxial substrates. The close coupling to ground of the npn base is the dominant factor which increases the trigger voltage of these devices in modern technologies. Therefore, a need exists to reduce the degree of coupling to ground for the npn device, in a manner which is compatible with the semiconductor manufacturing process.

BRIEF DESCRIPTION OF THE DRAWINGS

A better understanding of the present invention can be obtained when the following detailed description of a preferred embodiment is considered in conjunction with the following drawings, in which.

Figure 1:
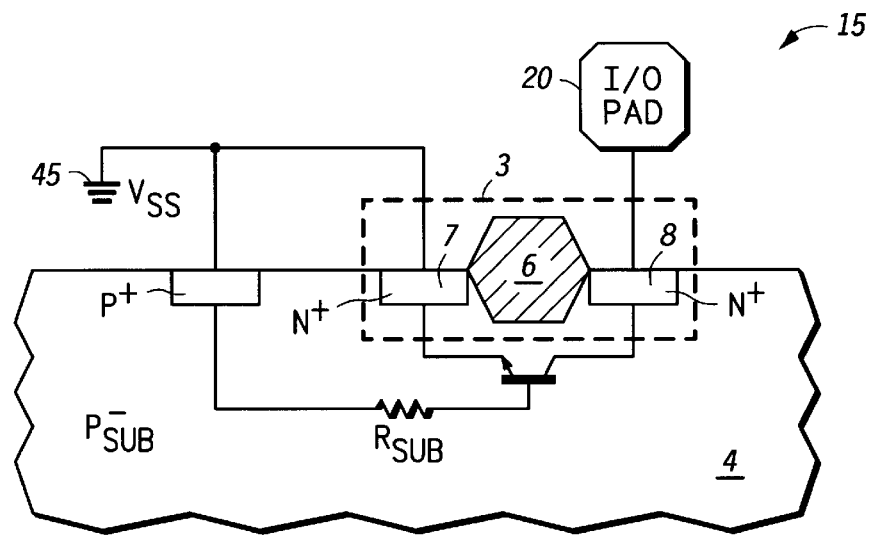
FIG. 1 depicts a partial block diagram, partial schematic diagram of a prior art TFO npn device.

It will be appreciated that for simplicity and clarity of illustration, elements illustrated in the drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION OF A PREFERRED EMBODIMENT

While several embodiments of the present invention will be described in detail below, the present invention common to all embodiments lies in a semiconductor device having a substrate with a first conductivity type. The substrate has a top substrate region that also has the first conductivity type. A first doped region, a second doped region and a third doped region are located in the top substrate region where the first and second doped regions have a second conductivity type opposite the first conductivity type while the third doped region has the first conductivity type; the third region being located between the first and second doped regions. A doped well region is also in the top substrate region and has the second conductivity type and has the second doped region and at least a portion of the third doped region located therein.

The present invention also provides for a method of forming a semiconductor device. The method includes providing a substrate and a top substrate region, each having the first conductivity type. A doped well region, having a second conductivity type opposite the first conductivity type, is then formed in the substrate. A first doped region and a second doped region are then formed in the top substrate region, each of these regions having the second conductivity type. A third doped region, located between the first and second doped regions, is then formed, where the third region has the first conductivity type and where the second doped region and at least a portion of the third doped region are located within the doped well region The embodiments of the present invention will now be described in detail with reference to FIGS. 2–9. It is noted that throughout this detailed description, certain layers of materials will be deposited and removed to form the semiconductor device. Where the specific procedures for depositing such layers or thicknesses of such layers are not detailed below, conventional techniques to one skilled in the art for depositing or otherwise forming such layers at appropriate thicknesses shall be intended. Such details are well known and not considered necessary to teach one skilled in the art of how to make or use the present invention.

Figure 2:
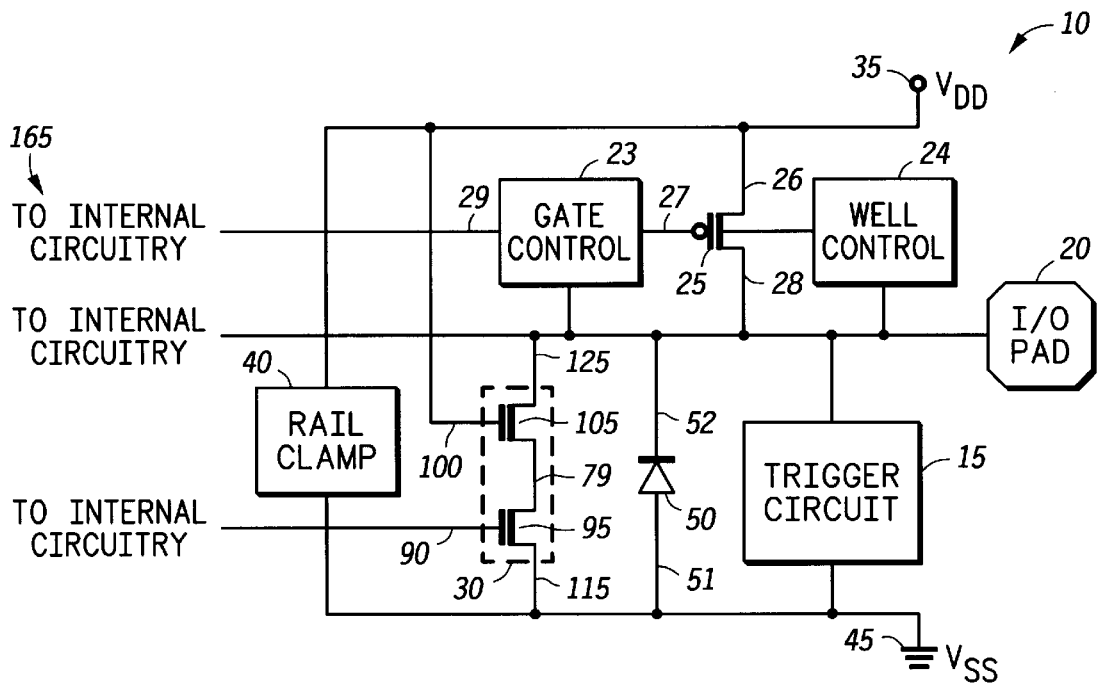
FIG. 2 depicts a partial block diagram, partial schematic diagram of a high voltage tolerant input/output pad of the present invention.

FIG. 2 depicts a partial block diagram, partial schematic diagram of a high voltage tolerant input/output pad 10 of the present invention. The high voltage tolerant input/output pad 10 has an I/O pad 20 that receives or generates a voltage level that is transmitted to the high voltage tolerant input/output pad 10 or to an external device. The I/O pad 20 may output voltages in the range of 0 to 3.3 volts, or in other embodiments, the I/O pad 20 may receive voltage levels from other devices external to the high voltage tolerant input/output pad 10 which may also be in the range of between 0 to 5.0 volts. The I/O pad 20 is connected to a current electrode 28 of a p-type MOSFET 25 (PMOS pull-up buffer) and to a current electrode 125 of a stacked-gate buffer 30. Another current electrode 26 of the MOSFET 25 is coupled to a second power supply electrode ($V_{DD}$) 35. The second power supply electrode 35 is coupled to a control electrode 100 of a second transistor 105 of the stacked-gate buffer 30. A gate electrode 27 of the MOSFET 25 is coupled to internal circuitry that controls the MOSFET 25. Likewise, the I/O pad 20, current electrode 28, the well control circuit 24, the gate control circuit 23, the second terminal 52 of diode 50, and the current electrode 125 of the second transistor 105 of the stacked-gate buffer 30 are also connected to internal circuitry, which is used for additional processing of input signals received from external devices. A rail clamp 40 may be the inherent capacitance of an integrated circuit incorporating the high voltage tolerant input/output pad 10, if it is sufficient, or may be an active circuit that provides a discharge path between the second power supply electrode 35 and a first power supply electrode 45 during an ESD or EOS event. The first power supply electrode 45 is coupled to the ESD protection circuit 15, the rail clamp 40 and an electrode 115 of the first transistor 95 of the stacked-gate buffer 30. The first power supply electrode 45 is also coupled to a first terminal 51 of diode 50 such that the diode conducts when the first power supply electrode 45 is approximately 0.5 volts higher than the voltage present on the I/O pad 20 which is connected to the diode 50 by the second terminal 52.

The general operation of the high voltage tolerant input/output pad 10 is as follows. Transistor 25 and stacked-gate buffer 30 form an output buffer which is used to transfer signals generated within the chip to devices external to the chip via I/O pad 20. Transistor 25 forms the pull-up portion of the output buffer which is used to couple I/O pad 20 to the $V_{DD}$ supply rail 35 thereby supplying a high level signal (3.3V). Stacked-gate buffer 30 is used to couple the I/O pad 20 to the first supply electrode 45 (i.e. forms a pull-down portion), thereby supplying a low level signal (0V). When the high voltage tolerant input/output pad 10 is functioning as an output buffer, the internal circuitry (not shown) simultaneously supplies the signal to be output to the input terminal 29 of gate control circuit 23 (which simply passes the signal to the control electrode 27 of transistor 25 in this mode) and to the control electrode 90 of stacked-gate buffer 30.

If the I/O buffer 10 is used as an input driver circuit, the internal circuitry (not shown) maintains the input terminal 29 of the gate control circuit 23 (and consequently the control electrode 27 of transistor 25) at 3.3V, and the control electrode 90 of transistor 95 at 0V, which prevents current flow in either transistor. The I/O pad 20 is now free to receive signals which are generated external to the chip and are subsequently processed by internal circuitry (not shown). The range of these externally applied input signals for high-voltage tolerant applications is between 0V and 5.0V. For external signals which exceed $V_{DD}$ (3.3V), gate control circuit 23 raises the control electrode 27 of transistor 25 to the potential of the I/O pad 20, which guarantees that transistor 25 remains off. Gate control circuit 23 also keeps the new high potential from appearing at node 29 which is maintained at 3.3V. The series connection of transistors 105 and 95 is also used to accommodate the application of input signals in excess of the second power supply electrode 35 (3.3V), the magnitude of which typically exceeds the maximum $V_{DS}$ and $V_{DG}$ of most submicron technologies (approximately 3.6V). For example, if 5.0V is applied to I/O pad 20, then the full magnitude of this potential appears across the stacked-gate buffer 30. However, the magnitude of the potentials across each transistor in 30 does not exceed maximum allowable values. For example, when 5.0V is applied to I/O pad 20, the maximum potential that can appear at node 79 is $V_{DD}-V_{TN}$, or roughly, 3.3V–0.5V= 2.8V. Thus, the maximum $V_{DS}$ across transistor 105 is 2.2V and across transistor 95 is 2.8V. The externally applied 5V signal has been split between the series connection of transistor 105 and transistor 95. Similarly, the maximum allowable $V_{DG}$ has also not been exceeded since only 5.0V–3.3V=1.7V will appear across the drain to gate terminals of the second transistor 105, and 2.8V–0V=2.8V will appear across the drain to gate terminals of the first transistor 95. Thus, the use of the stacked-gate buffer 30 facilitates the application of high voltage input signals to I/O pad 20 in a manner which is compatible with a standard logic process. In a similar manner, well control circuit 24 and gate control circuit 23 are needed to keep the PMOS pull-up buffer 25 from conducting during the application of the external high voltage signal. The structural details of well control circuit 24 and gate control circuit 23 are not necessary for one of ordinary skill in the art to make or use the present invention and, accordingly, such detail will not be provided herein.

Figure 3:
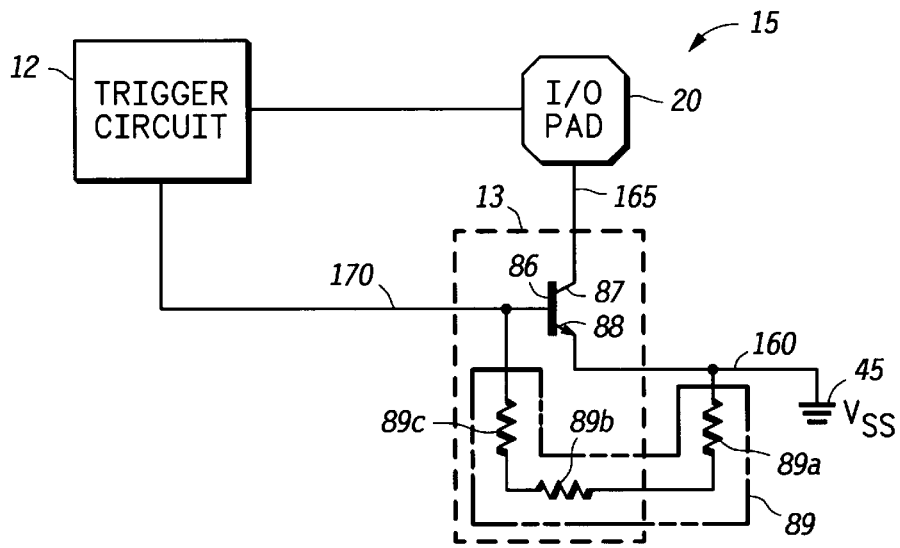
FIG. 3 depicts a partial block diagram, partial schematic diagram of an ESD protection circuit.

The high voltage tolerant input/output pad 10 has a circuit for electrostatic discharge protection 15 (ESD protection circuit 15) that provides protection against ESD and EOS events. The specific elements of the ESD protection circuit 15 are shown in FIG. 3, which is a partial block diagram and a partial schematic diagram of ESD protection circuit 15. The structure and operation of the ESD trigger circuit 12 is disclosed in U.S. patent application entitled "Circuit For Electrostatic Discharge Protection", Ser. No. 08/801,874, incorporated herein by reference. While the trigger circuit 12 initiates ESD protection for the ESD protection circuit 15, the lateral bipolar device 13 conducts the majority of the dissipation current during the ESD event. Trigger circuit 12 serves to initiate current flow in the lateral bipolar device 13 by lowering its trigger voltage via the substrate triggering effect. The lateral bipolar device 13 has a first current carrying electrode 88 that is electrically connected to a first power supply Vss 45 by a first interconnect 160. The lateral bipolar device 13 also has a second current carrying electrode 87 that is electrically connected to the I/O pad 20 by a second interconnect 165 and a first control electrode 86 that is electrically connected to the trigger circuit 12 by a third interconnect 170. The first control electrode 86 is also ultimately coupled to the first power supply Vss 45 by resistor 89, which is the inherent substrate resistance seen by the control electrode 86. Recall that the base (i.e. control electrode) of lateral bipolar device 13 is the substrate, which means that a substrate resistance component is always present between the control electrode 86 and the substrate, which is coupled to Vss 45. As will be shown later, the control of this inherent resistance, in a manner which requires no additional process complexity, is a key feature of the invention described herein. The first 88 and second 87 current carrying electrodes and the first control electrode 86, in a further embodiment, are first 88, second 87 and third 86 doped regions, respectively, as detailed below. The first 88 and second 87 current carrying electrodes and the first control electrode 86 all have a doping concentration of at least $10^{19}$, i.e. where an ohmic contact begins to occur to thereby make such electrodes conductive. Furthermore, the first 88 and second 87 current carrying electrodes and the first control electrode 86 form the emitter, collector and base, respectively, of the lateral bipolar device 13.

Trigger circuit 12 functions with lateral bipolar device 13 by first detecting an ESD (or EOS) event and then supplying trigger current to the control electrode 86 (which is resistively coupled to the substrate) of lateral bipolar device 13. This trigger current, ($I_{trig}$), then flows to power supply 45 through substrate resistor 89 ($R_{sub}$). In a similar manner to what was described earlier for the TFO npn device 3 (FIG. 1), once the product of $I_{trig} \times R_{sub} > 0.7V$, the base-emitter junction of lateral bipolar device 13 can forward bias which turns the device on. The main difference between the TFO npn device of FIG. 1 and the lateral bipolar device 13 of FIG. 3 is that the current used to turn on the lateral bipolar device 13 is supplied by the trigger circuit 12, rather than from avalanche-breakdown of the collector/base junction. For a given $R_{sub}$, if the trigger circuit can supply a trigger current $I_{trig}$ that is greater than the trigger current that would otherwise be generated by avalanche-breakdown at a given collector-to-emitter voltage, then the lateral bipolar device 13 will trigger sooner, which is desirable. That is, once the product of $I_{trig} \times R_{sub} > 0.7V$, the bipolar device will turn on. An alternative viewpoint is that for a given $I_{trig}$, a lateral bipolar device with a higher $R_{sub}$ will trigger sooner than one with a lower $R_{sub}$. $I_{trig}$ is set by the drive capability of trigger circuit 12. Increasing the $I_{trig}$ for a given pad voltage means increasing the area needed for trigger circuit 12, which is bounded by practical limits set by manufacturing costs (with increase with die area). $R_{sub}$ is determined by the particular substrate engineering which cannot be optimized independently of other electrical parameters of the semiconductor process. Thus, parity must be reached between the size constraints of trigger circuit 12 and the $R_{sub}$ that is inherent to the lateral bipolar device 13.

Figure 4:
FIG. 4 depicts a cross-sectional view of an embodiment of the semiconductor device of the present invention after performing a step in the method of forming such device.

FIG. 4 depicts a cross-sectional view of an embodiment of the semiconductor device of the present invention after performing a step in the method of forming such device. In FIG. 4, a semiconductor device substrate 60 has a substrate 65 and a top substrate region 70 overlying the substrate 65. The substrate 65 is typically a silicon substrate, however, germanium, silicon germanium, silicon-on-insulator or the like may also be used. The substrate 65 is doped with a dopant having a first conductivity type, typically a p++ type dopant, while the top substrate region 70 is also doped with a dopant having the same first conductivity type, typically p-type dopant, that is epitaxially grown on the substrate 65. It is understood that the top substrate region 70 may already be formed on the semiconductor device substrate and thereby not requiring the doping step previously described. While both the substrate 65 and top substrate region 70 have the same first conductivity type, the top substrate region 70 has a lower doping concentration than the doping concentration of the substrate 65. A direct result of the increased doping level of substrate 65 relative to top substrate 70 is that substrate 65 exhibits a greatly reduced resistivity when compared to top substrate region 70. In general, a low resistivity substrate is highly desirable in submicron technologies since it suppresses the occurrence of the well known phenomenon called "latch-up". In a further embodiment, the semiconductor device substrate 60 may also be a substrate having a first portion 70 overlying a second portion 65. Both the first 70 and second 65 portions have a first conductivity type, for example a p-type doping concentration, and the first portion 70 has a lower doping concentration compared to the second portion 65. Again, in this embodiment, the first portion 70 is typically an epitaxially grown silicon layer having a p-type dopant concentration. Accordingly, it is the comparative doping concentration between the two portions in one embodiment or the substrate and the top substrate region in another embodiment that is important.

Figure 5:
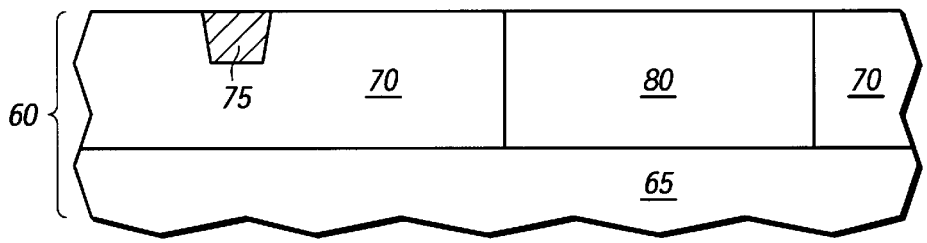
FIG. 5 depicts a cross-sectional view of an embodiment of the semiconductor device of the present invention after performing a further step in the method of forming such device.

FIG. 5 depicts a cross-sectional view of an embodiment of the semiconductor device of the present invention after performing a further step in the method of forming such device. In FIG. 5, two regions have been formed in the top substrate region 70. An insulating region 75 is formed in the top substrate region 70 in order to provide isolation between the lateral bipolar device 13 of FIG. 3 and other devices in the high voltage tolerant input/output pad 10. The isolation region 75 is an insulating material, typically an oxide, and may be formed using conventional shallow trench techniques or LOCOS techniques to isolate devices in the semiconductor device substrate 60. A doped well region 80 is also formed, in the step depicted in FIG. 5, in the top substrate region 70 of the semiconductor device substrate 60. The doped well region 80 is doped with a dopant, such as an n-type dopant, having a second conductivity type that is opposite the first conductivity type of the substrate 65 and the top substrate region 70. The doped well region 80 is typically at least 0.5 microns deep and generally extends to at least the substrate 65. The depth of the doped well region 80 has certain importance in this embodiment of the present invention. The doped well region 80 has the effect of realizing a deeper collector (the second doped region 87 of FIG. 7 forms the collector contact), which can collect more electrons injected by the emitter, i.e. the first doped region 88 of FIG. 7. Thus, due to the "depth" of the doped well region 80, the bipolar action of the lateral bipolar device 13 of FIG. 3 occurs "deeper" in the top substrate region 70 which is desirable.

Figure 6:
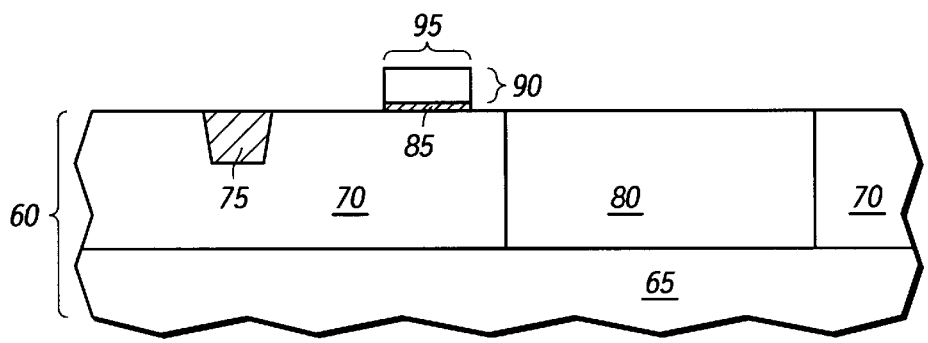
FIG. 6 depicts a cross-sectional view of an embodiment of the semiconductor device of the present invention after performing a still further step in the method of forming such device.

FIG. 6 depicts a cross-sectional view of an embodiment of the semiconductor device of the present invention after performing a still further step in the method of forming such device. In FIG. 6, a gate structure 95 has been formed overlying the top substrate region 70. The gate structure 95 is formed by certain conventional steps (not shown) that include first depositing a gate dielectric material 85 overlying the top substrate region 70 of the semiconductor device substrate 60. The gate dielectric material 85 is typically an oxide layer of approximately 30 to 100 angstroms in thickness. A gate electrode material 90 is then deposited overlying the gate dielectric material 85. The gate electrode material is typically a doped polysilicon material, however, other metal containing materials, metal nitrides, or metal silicides may also be used. The gate structure 95 is then formed by patterning the gate dielectric material 85 and the gate electrode material 90 to form the gate dielectric layer 85 and the gate electrode 90. The gate electrode 90 controls the gate structure 95. The gate structure 95 provides certain advantages to the device of the present invention. Recall that prior art TFO npn device was used instead of the gate structure 95 for ESD protection of internal circuits. However, the TFO devices result in a wider basewidth between the doped regions comprising the TFO, such as the first n+ doped region coupled to Vss and the second n+ doped region coupled to the bondpad of FIG. 1. Such a wider basewidth causes the undesirable decrease in the gain of the TFO npn device. The use of trench isolation further reduces the gain of the TFO npn device since the trench is usually deeper than the junction depth. In contrast, the gate structure 95 for the lateral bipolar device 13, in conjunction with the well region 80, permits a smaller basewidth 98 due to the scalability of the gate structure 95 which thereby increases the gain of the device 13. Furthermore, the use of the gate structure 95 inhibits the formation of field oxide between the first 88 and the third 86 doped regions which increases the viability of carrier flow between the first doped region 88 (the emitter) and the combination of the well region 80 and second doped region 87, which comprises the collector and collector contact respectively. This is because the injected carriers do not have to "travel around" such a field oxide. This largely effects trench isolated technologies where the trench may be too deep to permit any device not having a gate structure to operate. Additionally, there is no "penalty" for using the gate structure 95 during normal operation of the lateral bipolar device 13. The gate dielectric layer 85 is not exposed to a high voltage during normal operation since the gate structure 95 is electrically connected to either the third doped region 86 which is electrically coupled to the substrate 60 in normal operation (which is at 0V) or the first doped region 88 which is also connected to the first power supply 45, which is also at 0V in normal operation. During an ESD or EOS event, the third doped region 86 (FIG. 7) only reaches a low voltage (of about 1–2V) since the trigger circuit 12 has limited current drive capability. Thus, there is no penalty for using the gate structure 95. It should be noted, however, that in other embodiments, a gate structure 95 may not be needed should the lateral bipolar device be needed for less aggressive technologies where the benefits of the gate structure 95 may not be essential.

Figure 7:
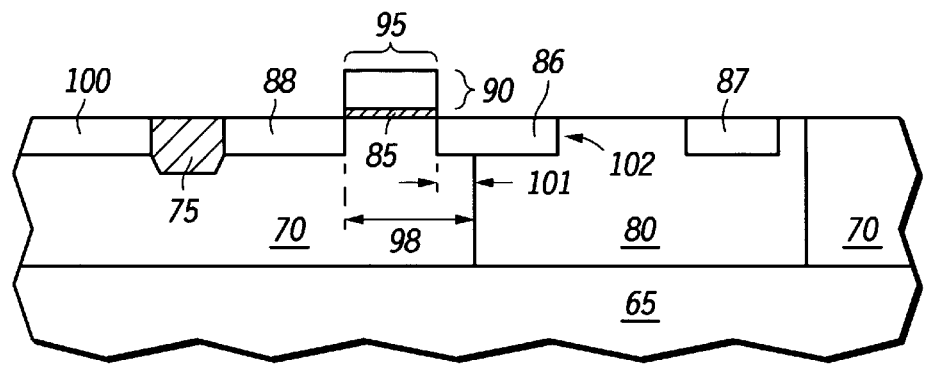
FIG. 7 depicts a cross-sectional view of an embodiment of the semiconductor device of the present invention after performing another step in the method of forming such device.

FIG. 7 depicts a cross-sectional view of an embodiment of the semiconductor device of the present invention after performing another step in the method of forming such device. In FIG. 7, a substrate tie region 100 is formed in the top substrate region 70 which is doped with a dopant of similar conductivity type to the substrate 65 and top substrate region 70. The substrate tie region 100 is used as an ohmic contact to the substrate 65 and top substrate region 70 and is ultimately coupled to the chip first power supply electrode 45 of FIG. 2. Since the substrate 65 has a lower resistivity than top substrate region 70, the substrate 65 is ultimately more strongly coupled to the first power supply electrode 45 (ground). Thus, the substrate 65 can more efficiently extract excess holes due to its lower resistivity (i.e., it has lower resistance). Next in FIG. 7, a first doped region 88 and a second doped region 87 have been formed in the top substrate region 70. The first 88 and second 87 doped regions are doped with a dopant having a second conductivity type, typically an n-type dopant, that is opposite the first conductivity type of the semiconductor device substrate 60. The first 88 and second 87 doped regions are formed using conventional doping techniques and are no more than approximately 0.3 um deep in the top substrate region 70. A further step, also depicted in the device of FIG. 7, is the step of forming the third doped region 86 in the top substrate region 70. The third doped region 86 is also doped, but unlike the first 88 and second 87 doped regions, the third doped region 86 is doped with a dopant having a first conductivity type, typically a p-type dopant using conventional doping techniques. Like the first 88 and second 87 doped regions, the third doped region 86 is no more than approximately 0.3 um deep and is located between the first doped region 88 and the second doped region 87. Other embodiments require the doped well region to be at least approximately 1.5 times deeper than the second 87 and third 86 doped regions for the reasons provided above relating to having a deeper collector, which can collect more electrons injected by the first doped region 88, i.e. emitter, that makes the bipolar action occur "deeper" in the top substrate region 70 which is desirable.

From FIG. 7, it is apparent that at least a portion of the third doped region 86 and the entire second doped region 87 are located within the doped well region 80. The overlap of the deep doped region 80 and the third doped region 86 has a strong effect on altering the resistance that the third doped region sees between itself and the first power supply electrode 45 ($V_{ss}$). This resistance was represented by resistor 89 in FIG. 3. Resistor 89 ($R_{sub}$) is composed of three components (two vertical and one horizontal) where $R_{89}=R_{89a}+R_{89b}+R_{89c}$. $R_{89a}$ is the first vertical component of substrate resistance that exists between the substrate tie region 100 in FIG. 7 and the substrate region 65. $R_{89b}$ is the first horizontal component of substrate resistance that exists below substrate tie region 100 to below the third doped region 86, and is primarily determined by the doping concentration of substrate region 65. $R_{89c}$ is the second vertical component of substrate resistance that exists between the third doped region 86 and the substrate region 65.

In general, the resistance exhibited by an ohmic contact is inversely proportional to its area, that is, the larger the area the smaller the resistance and vice-versa. In a typical chip, there are many substrate tie regions similar to substrate tie region 100, which results in a large total area of substrate ties. Consequently, this means that the resistance seen between the Vss electrode 45 and the substrate region 65 is usually very small, which in turn means that $R_{89a}$ is very small. Thus, the substrate region 65 is very closely coupled to the Vss potential (0V). Furthermore, since the doping concentration of the substrate region 65 is very high, and since it exists beneath the entire chip (i.e. has a relatively large area), its resistance is also very small. Thus, the total resistance seen between the third doped region 86 and the Vss electrode 45 is dominated by $R_{89c}$, which is inversely proportional to the area of the third doped region 86.

It is desirable for the third doped region 86 to extend along the entire width (i.e. perpendicular to the cross section of FIG. 7) of lateral bipolar device 13, so that the entire width is turned on during an ESD event (which translates to a higher level of protection). However, this is in direct opposition to the requirement of needing a higher $R_{sub}$. These conflicting requirements are simultaneously met by overlapping the third doped region 86 with the deep doped region 80. This reduces the contact area 101 of the third doped region 86 and the top substrate region 70, which in turn increases the resistance seen by doped region 86 to the substrate region 65 which is very strongly coupled to Vss (0V). This has the effect of greatly increasing the substrate resistance between the base of the lateral bipolar device 13 (i.e. third doped region 86) which lowers the trigger voltage.

Furthermore, the junction 102 between the deep doped region 80 and the third doped region 86 is always reverse biased since the deep doped region 80 is coupled to the I/O pad 20, which is always at the highest potential during positive-to-Vss or positive-to-Vdd ESD discharges (which are polarities that ESD circuit 15 is designed to protect against, negative discharges are handled by diode 50 and rail clamp 40). The junction 102 is always reversed biased in normal operation since the I/O pad 20 will not drop below Vss. The requirement of having uniform injection during ESD events is also met and holes injected by the third doped region 86 are injected in a direction facing the emitter 88 (which is where they are needed). This results in less "wasted" holes to the substrate 65 which forward biases the base/emitter junction sooner which lowers the trigger voltage to provide better ESD protection.

Figure 8:
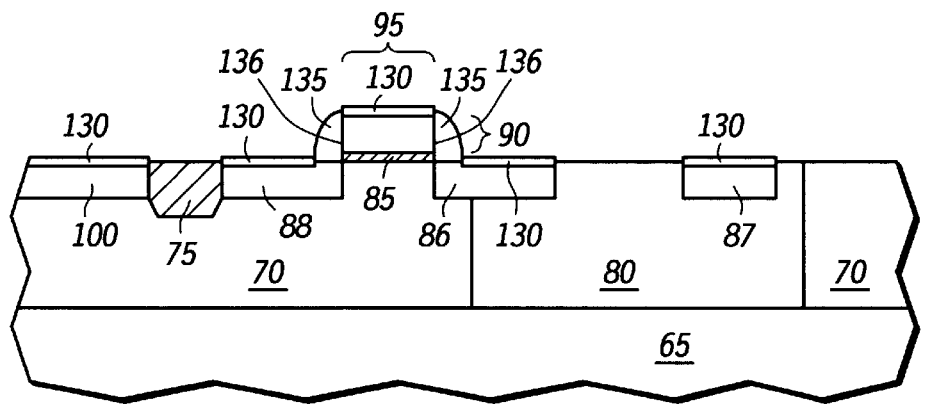
FIG. 8 depicts a cross-sectional view of an embodiment of the semiconductor device of the present invention after performing still another step in the method of forming such device.

FIG. 8 depicts a cross-sectional view of an embodiment of the semiconductor device of the present invention after performing still another step in the method of forming such device. In FIG. 8, spacers 135 have been formed along the gate structure 95. The spacers 135 are formed along gate structure sidewalls 136 of the gate structure 95. The spacers are typically formed of silicon nitride, and are necessary to keep the gate structure 95 electrically isolated from the first doped region 88 and the third doped region 86 after the deposition of the metal containing layer 130 as described below. A metal containing layer 130 is then deposited over the gate structure 95 and over the first 88, second 87 and third 86 doped regions; the substrate tie region 100 and the top substrate region 70. The metal containing layer 130 reacts with portions of the doped regions 88, 86, 87; the substrate tie region 100, the top substrate region 70 and the gate structure 95 to form salicide regions 130. Any unreacted portions of the metal containing layer 130 is then removed. The salicide regions 130 add a further advantage to the present embodiment of the invention by lowering the series resistance associated with each doped region.

Figure 9:
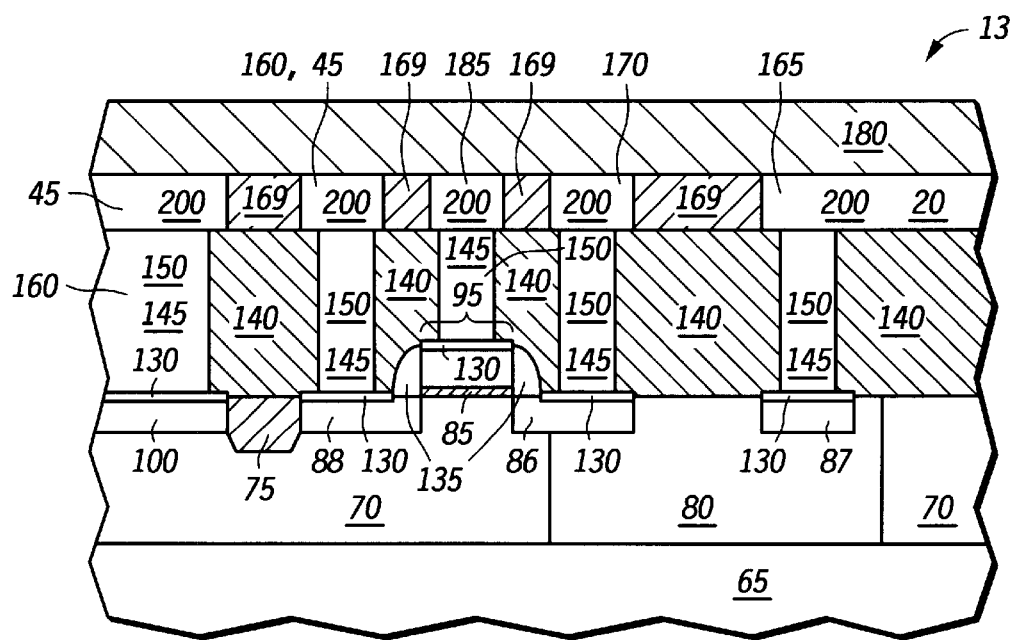
FIG. 9 depicts a cross-sectional view of an embodiment of the semiconductor device of the present invention.

FIG. 9 depicts a cross-sectional view of an embodiment of the semiconductor device of the present invention. In FIG. 9, an interlayer dielectric layer 140 has been deposited over the semiconductor device of FIG. 8 and patterned to form the contacts 145 in the interlayer dielectric 140. In the contacts 145, a metal containing layer 150 is deposited in the contacts to make an electrical connection to other devices in the lateral bipolar device 13. The metal containing layer 150 is typically tungsten, however aluminum and aluminum silicides or copper may also be used. A first interconnect 160 electrically connects the first doped region 88 and substrate tie region 100 to a first power supply. A second interconnect 165 electrically connects the second doped region 87 to the I/O pad 20. Then a third interconnect 170 electrically connects the third doped region 86 to the trigger circuit 12. A gate interconnect 185 electrically connects the gate structure 95 to either the first power supply 45 (ground) or the third doped region 86. After the metal containing layer 150 is deposited and patterned, a second interlayer dielectric 169 is formed and patterned. Next, the second metal containing layer 200 is formed and patterned. Then, a passivation layer 180, which may be several layers, is formed thereon to protect the device. The passivation layer 180 may be silicon nitride, silicon oxide, silicon oxynitride, polymide or a combination thereof.

In operation, a lateral bipolar device has been presented which is used to provide ESD/EOS protection for high voltage tolerant applications. The lateral bipolar device has the characteristics of increased current gain, reduced coupling of its control electrode to the substrate and robust operation which renders it useful for the substrate triggering technique. The device is also fully compatible with a standard logic process and requires no additional process steps or process costs.

It is understood that additional embodiments may also be formed that fall within the scope of the present invention as claimed below.

I claim:

1. A semiconductor device comprising:

a trigger circuit;

a protection device including:

a first top substrate region overlying a substrate, said first top substrate region having a first conductivity type;

a second top substrate region overlying said substrate, said second top substrate region having a second conductivity type that is opposite said first conductivity type, wherein said first and second top substrate regions abut each other:

a first doped region in said first top substrate region, said first doped region having said first conductivity type;

a second doped region having said second conductivity type, wherein said second doped region lies within portions of said first and second top substrate regions, wherein said trigger circuit is coupled to said second doped region;

a third doped region in said second top substrate region, said third doped region having said first conductivity type; and a feature abutting said second top substrate region, wherein:

said feature having said second conductivity type and a doping concentration higher than said second top substrate region; and said feature is selected from a group consisting of: said substrate; and a fourth doped region in said second top substrate region.

2. The semiconductor device of claim 1, wherein said protection device includes a lateral bipolar transistor.

3. The semiconductor device of claim 1, wherein each of said first doped region, said second doped region and said third doped regions has a doping concentration of at least $10^{19}$.

4. The semiconductor device of claim 1, wherein:

said protection device further comprises:

a dielectric layer overlying portions of said second top substrate region, said second doped region, and said third doped region; and an electrode overlying said portions of said second top substrate region, said second doped region, and said third doped region, wherein said electrode is spaced apart from said second top substrate region, said second doped region, and said third doped region by said dielectric layer; and a portion of said second top substrate region lies between and separates said second doped region from said third doped region.

5. The semiconductor device of claim 4, wherein said electrode is electrically connected to a power supply terminal.

6. The semiconductor device of claim 4, wherein said electrode is electrically connected to said trigger circuit.

7. The semiconductor device of claim 4, wherein a salicided region overlies said electrode.

8. The semiconductor device of claim 1, wherein said feature is said substrate.

9. The semiconductor device of claim 1, wherein each of said first and second top substrate regions abuts said substrate.

10. The semiconductor device of claim 1, wherein said first top substrate region is at least approximately 0.5 um deep, and wherein each of said second doped region and said first doped region is no more than approximately 0.3 um deep.

11. The semiconductor device of claim 1, wherein said first top substrate region is at least approximately 1.5 times deeper than each of said second doped region and said first doped region.

12. The semiconductor device of claim 1, further comprising:

a first interconnect connected to said first doped region, said first interconnect electrically connecting said first doped region to a pad;

a second interconnect connected to said second doped region, said second interconnect electrically connecting said second doped region to said trigger circuit; and a third interconnect connected to said third doped region, said third interconnect electrically connecting said third doped region to a power supply terminal.

13. The semiconductor device of claim 1, wherein a salicided region overlies said first doped region, said second doped region and said third doped region.

14. The semiconductor device of claim 1, wherein:

said substrate has said second conductivity type;

said substrate has a doping concentration higher than said second top substrate region; and said substrate abuts said first and second top substrate regions.

15. The semiconductor device of claim 1, wherein said feature is said fourth doped region.

16. The semiconductor device of claim 1, wherein said protection device has only one transistor.

17. A semiconductor device comprising:

a protection device including:

a first top substrate region overlying a substrate, said first top substrate region having a first conductivity type;

a second top substrate region overlying said substrate, said second top substrate region having a second conductivity type that is opposite said first conductivity type, wherein said first and second top substrate regions abut each other:

a first doped region in said first top substrate region, said first doped region having said first conductivity type;

a second doped region having said second conductivity type, wherein:

said second doped region lies within portions of said first and second top substrate regions; and said second doped region is spaced apart from said first doped region;

a third doped region in said second top substrate region, wherein:

said third doped region having said first conductivity type; and said third doped region is spaced apart from said second doped region; and a feature abutting said second top substrate region, wherein:

said feature having said second conductivity type and a doping concentration higher than said second top substrate region; and said feature is selected from a group consisting of:
said substrate; and
a fourth doped region in said second top substrate region; and
a pad, wherein within said protection device, said pad is electrically connected to a doped region having a first conductivity type and is not electrically connected to any doped region having said second conductivity type.

18. The semiconductor device of claim 17, wherein within said protection device, said pad is electrically connected only to said first doped region.

19. The semiconductor device of claim 17, wherein said protection device includes a lateral bipolar transistor.

20. The semiconductor device of claim 17, wherein:
said substrate has said second conductivity type;
said substrate has a doping concentration higher than said second top substrate region; and
said substrate abuts said first and second top substrate regions.

21. The semiconductor device of claim 17, wherein said semiconductor device further comprises a trigger circuit electrically connected to said second doped region.

22. The semiconductor device of claim 17, wherein within said protection device, said pad is only electrically connected to said first doped region.

23. The semiconductor device of claim 22, wherein said electrode is electrically connected to a power supply terminal.

24. The semiconductor device of claim 22, wherein said electrode is electrically connected to said trigger circuit.

25. The semiconductor device of claim 17, wherein:
said protection device further comprises:
a dielectric layer overlying portions of said second top substrate region, said second doped region, and said third doped region; and
an electrode overlying said portions of said second top substrate region, said second doped region, and said third doped region, wherein said electrode is spaced apart from said second top substrate region, said second doped region, and said third doped region by said dielectric layer; and
a portion of said second top substrate region lies between and separates said second doped region from said third doped region.

26. The semiconductor device of claim 17, wherein said protection device has only one transistor.

* * * * *